United States Patent
Bramanti

(10) Patent No.: US 11,604,853 B2
(45) Date of Patent: Mar. 14, 2023

(54) SYSTEM AND METHOD FOR PERFORMING VECTOR ROTATION

(71) Applicant: STMicroelectronics S.r.l., Agrate Brianza (IT)

(72) Inventor: Alessandro Paolo Bramanti, Maglie (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 79 days.

(21) Appl. No.: 17/071,577

(22) Filed: Oct. 15, 2020

(65) Prior Publication Data

US 2021/0117501 A1 Apr. 22, 2021

Related U.S. Application Data

(60) Provisional application No. 62/923,356, filed on Oct. 18, 2019.

(51) Int. Cl.
| | |
|---|---|
| *G06F 17/16* | (2006.01) |
| *G01R 33/00* | (2006.01) |
| *G01V 7/06* | (2006.01) |
| *G01P 15/18* | (2013.01) |

(52) U.S. Cl.
CPC ............ *G06F 17/16* (2013.01); *G01P 15/18* (2013.01); *G01R 33/0023* (2013.01); *G01V 7/06* (2013.01)

(58) Field of Classification Search
CPC .......... G06F 17/16; G06F 17/10; G01P 15/18; G01R 33/0023; G01V 7/06
See application file for complete search history.

(56) References Cited

U.S. PATENT DOCUMENTS

| | | | |
|---|---|---|---|
| 4,064,504 A | 12/1977 | Lepetit et al. | |
| 4,415,856 A | 11/1983 | Welles | |
| 5,877,710 A | 3/1999 | Kagerbauer | |
| 7,406,772 B2 | 8/2008 | Siraky | |
| 9,455,726 B1 | 9/2016 | Wei et al. | |
| 9,606,961 B2* | 3/2017 | Uliel | G06F 9/30112 |
| 9,742,425 B2 | 8/2017 | Kawase | |
| 9,742,432 B2 | 8/2017 | Kmiecik et al. | |
| 2006/0106902 A1* | 5/2006 | Howard | H04L 25/0248 708/200 |
| 2010/0214216 A1* | 8/2010 | Nasiri | G03B 17/00 345/158 |

(Continued)

*Primary Examiner* — Stephanie E Bloss

(74) *Attorney, Agent, or Firm* — Seed Intellectual Property Law Group LLP

(57) ABSTRACT

A method and system for rotating a vector, including at least one lookup table (LUT) including data corresponding to the vector being rotated around a first angle and a second angle, processing circuitry configured for accessing the at least one LUT for incrementally rotating the vector around the first and second angles, where accessing includes identifying an LUT input entry and selecting a corresponding LUT output entry, the corresponding output entry including an incremental angular rotation (IAR) of the vector around the first angle or the second angle, and a comparator configured to generate a comparator signal based upon comparing a counter incremented by the IAR with the first angle or the second angle, the processing circuitry further configured to iteratively access the at least one LUT, based on the comparator signal, for completing the incremental rotation of the vector around the first angle and the second angle.

27 Claims, 9 Drawing Sheets

(56) References Cited

U.S. PATENT DOCUMENTS

| | | | |
|---|---|---|---|
| 2013/0273968 A1* | 10/2013 | Rhoads | H04M 1/0264 |
| | | | 455/566 |
| 2014/0354271 A1* | 12/2014 | Kawase | G01D 5/2451 |
| | | | 324/207.25 |
| 2016/0073962 A1* | 3/2016 | Yu | G01R 33/283 |
| | | | 600/407 |
| 2016/0098095 A1* | 4/2016 | Gonzalez-Banos | A63F 13/92 |
| | | | 345/156 |

* cited by examiner

SYSTEM AND METHOD FOR PERFORMING VECTOR ROTATION

BACKGROUND

Technical Field

The present application is directed generally to digital circuitry for performing vector operations, and, more specifically, to reduced-power digital circuitry that performs vector rotation.

Description of the Related Art

Mobile and wearable devices are already ubiquitous and the Internet of things (IoT) and coming 5G communications networks will only accelerate the growth of such devices. A typical mobile or wearable device includes sensors such as accelerometers and gyroscopes for movement analysis like pace counting and human activity recognition, as well as other types of sensors like microphones, proximity sensors, and so on. In operation, these sensors detect the corresponding parameter being sensed, such as orientation, motion or acceleration, and generate a corresponding analog electrical signal having characteristics indicating the sensed parameter. This analog signal is then typically digitized and some type of post-processing performed on the digital signal, such as filtering, scaling, and so on.

The specific type of post-processing performed depends on the type of sensor. This post-processing must not, however, consume much electrical power since the corresponding mobile or wearable device is typically battery powered. Moreover, the sensors and corresponding mobile or wearable device must be physically small so as to be utilized unobtrusively in a variety of different types of environments. While conventional circuits for performing this post-processing may be relatively simple, the power consumed by these circuits is limited in mobile and wearable devices.

Common post-processing operations that are performed on digital values of the digital signal from a sensor, such as an accelerometer or other sensors that generate data associated with vectors, may include rotation of the data to a standardized frame of reference, such as a frame of reference defined with respect to the gravitational vector of the earth, which conventionally requires arithmetic operations such as multiplication and division. These operations are easily performed through conventional circuits, such as a microcontroller, but such circuits typically consume a relatively large amount of power. As a result, conventional circuits for performing these operations may not be suitable for use in many mobile or wearable devices.

BRIEF SUMMARY

There is a need for digital circuitry for performing common operations, such as vector rotation operations for rotating vectors defined initially with respect to a reference frame fixed to the sensor to a standardized reference frame defined with respect to a universal invariant, while consuming a relatively small amount of power to enable the digital circuitry to be utilized in mobile and wearable devices.

Embodiments of the present disclosure are directed to methods and systems that utilize lookup tables (LUTs) for rotating a vector. In one embodiment, the vector is a reference vector that is rotated around a first angle and a second angle for aligning the vector with a coordinate axis or an axis of any given orientation. In another embodiment, the vector is a non-reference vector, such as an orientation, motion or acceleration vector as measured by a sensor, which is rotated around the same first and second angles for transforming the measured non-reference vector into a standard frame of reference defined in relation to the reference vector. These operations utilizing LUTs reduce the power consumption of circuitry that perform the rotations, thereby enable the inclusion of the circuitry in electronic devices having limited electrical power available, such as mobile and wearable devices.

According to an embodiment of the present disclosure, a method for rotating a vector having signed components, using a first lookup table LUT including data corresponding to the vector being rotated around a first angle associated with the first LUT and a second LUT including data corresponding to the vector being rotated around a second angle associated with the second LUT, is provided.

In one embodiment, the method includes determining a value of the first angle associated with the first LUT around which to rotate the vector, a sense of rotation around the first angle, a value of the second angle associated with the second LUT around which to rotate the vector, and a sense of rotation around the second angle, and setting a total incremental angular rotation counter to zero. The determining may be based on the signed components of the vector.

In an embodiment, the method includes accessing the first LUT for identifying a LUT input entry of the first LUT matching a LUT input, where the LUT input includes the signed components of the vector, identifying one of two LUT input entries adjacent to the identified LUT input entry based upon the determined sense of rotation around the first angle, and selecting an LUT output entry corresponding to the identified one of two adjacent LUT input entries, where the LUT output entry represents an incremental rotation of the vector around the first angle. The method includes incrementing the total incremental angular rotation counter by the incremental angular rotation, comparing the total incremental angular rotation counter with the value of the first angle around which the vector is being rotated, and generating a comparator signal based upon the comparison.

In an embodiment, the method includes iteratively repeating, based on the comparator signal, the accessing of the first LUT and the incrementing of the total incremental angular rotation counter for rotating the vector, until the total incremental angular rotation counter is equal to the value of the first angle and the vector is rotated around the first angle to an intermediate vector having signed intermediate components. The identified one of two adjacent LUT input entries in a current iteration is used as the identified LUT input entry in a next iteration.

In another embodiment, the method includes setting the total incremental angular rotation counter to zero, accessing the second LUT for identifying a LUT input entry of the second LUT matching the LUT input, where the LUT input represents the signed intermediate components of the intermediate vector, identifying one of two LUT input entries of the second LUT adjacent to the identified LUT input entry of the second LUT based upon the determined sense of rotation around the second angle, and selecting the LUT output entry corresponding to the identified one of two adjacent LUT input entries. The LUT output entry represents an incremental angular rotation of the intermediate vector around the second angle. The method further includes incrementing the total incremental angular rotation counter by the incremental angular rotation of the intermediate vector around the second angle, comparing the total incremental angular rotation counter with the value of the second angle around which the intermediate vector is being rotated, and generating a second comparator signal based upon the comparison.

In an embodiment, the method includes iteratively repeating, based on the second comparator signal, the accessing of the second LUT and the incrementing of the total incremental angular rotation counter for rotating the intermediate vector, until the total incremental angular rotation counter is equal to the value of the second angle and the intermediate vector is rotated around the second angle to a final vector having signed final components. The identified one of two adjacent LUT input entries of a current iteration is used as the identified LUT input entry in a next iteration.

According to an embodiment of the present disclosure, a method for rotating a vector around a first angle and around a second angle using a LUT having LUT input entries and LUT output entries is provided. Each LUT input entry corresponds with a plurality of LUT output entries. The method includes determining a value of the first angle around which to rotate the vector, a sense of rotation around the first angle, a value of the second angle around which to rotate the vector, and a sense of rotation around the second angle, and setting a total incremental angular rotation counter to zero. The determining may be based on signed components of the vector.

In an embodiment, the method includes accessing the LUT for identifying a LUT input entry matching a LUT input, where the LUT input represents the signed components of the vector, selecting an LUT output entry from the plurality of LUT output entries corresponding to the identified LUT input entry based on the first angle and the determined sense of rotation around the first angle, where the LUT output entry includes an incremental angular rotation of the vector around the first angle in the determined sense of rotation around the first angle, and the signed components of the incrementally rotated vector. The method further includes incrementing the total incremental angular rotation counter by the incremental angular rotation, comparing the total incremental angular rotation counter with the value of the first angle around which the vector is being rotated, and generating a comparator signal based upon the comparison. The method includes iteratively repeating, based on the comparison signal, the accessing of the LUT and the incrementing of the total incremental angular rotation counter for rotating the vector until the total incremental angular rotation counter is equal to the value of the first angle and the vector is rotated around the first angle. The vector is rotated to an intermediate vector having signed intermediate components. The signed components of the incrementally rotated vector in a current iteration is used as the LUT input in a next iteration.

In another embodiment, the method includes setting the total incremental angular rotation counter to zero, accessing the LUT for identifying a LUT input entry matching a LUT input, where the LUT input represents the signed intermediate components of the intermediate vector, and selecting the LUT output entry from the plurality of LUT output entries corresponding to the identified LUT input entry based on the second angle and the determined sense of rotation around the second angle, where the LUT output entry includes an incremental angular rotation of the intermediate vector in the determined sense of rotation around the second angle, and the signed components of the incrementally rotated intermediate vector. The method further includes incrementing the total incremental angular rotation counter by the incremental angular rotation of the intermediate vector, comparing the total incremental angular rotation counter with the value of the second angle around which the intermediate vector is being rotated, and generating a second comparator signal based upon the comparison.

In an embodiment, the method includes iteratively repeating, based on the second comparison signal, the accessing of the LUT and the incrementing the total incremental angular rotation counter by the incremental angular rotation of the intermediate vector for rotating the intermediate vector until the total incremental angular rotation counter is equal to the value of the second angle and the intermediate vector is rotated around the second angle. The intermediate vector is rotated to a final vector having signed final components. The signed components of the incrementally rotated intermediate vector in a current iteration is used as the LUT input in a next iteration.

According to an embodiment of the present disclosure, a system for rotating a vector having signed components includes at least one LUT. The at least one LUT includes data corresponding to the vector being rotated around a first angle and a second angle, where the at least at one LUT has LUT input entries and LUT output entries. The system further includes processing circuitry configured for accessing the at least one LUT for incrementally rotating the vector around the first angle and subsequently around the second angle, where accessing includes identifying an LUT input entry and selecting a corresponding LUT output entry, where the corresponding LUT output entry includes an incremental angular rotation of the vector around the first angle or the second angle. The system also includes a comparator configured to receive the incremental angular rotation of the vector, increment a total incremental angular rotation counter by the incremental angular rotation, compare the total incremental angular rotation counter with the first angle or the second angle around which the vector is being rotated, and generate a comparator signal based upon the comparison. The processing circuitry is further configured to receive the comparator signal, and based upon the comparator signal, iteratively access the at least one LUT for completing the incremental rotation of the vector around the first angle and the second angle.

BRIEF DESCRIPTION OF THE SEVERAL VIEWS OF THE DRAWINGS

For a better understanding of the present disclosure, embodiments thereof are now described purely by way of non-limiting example, with reference to the attached drawings, wherein.

DETAILED DESCRIPTION

The embodiments of the following description are directed to a low-power system and method for rotating vectors, generated by and/or utilized in a mobile or wearable device having one or more sensors with fixed reference frames, to a reference frame defined in relation to a universal standard, for example the gravitational vector, whose components are known at every location on or about the earth. Once the vectors have been rotated to a universal reference frame, the device may further process the rotated data for generating results, such as signals or further processed data defined with respect to the universal reference frame, for use by the device or for export to systems external to the device. Data rotated to a universal reference frame have more utility, being independent upon any particular orientation of the sensing device that provided the initial vectors or measurements.

Figure 1:
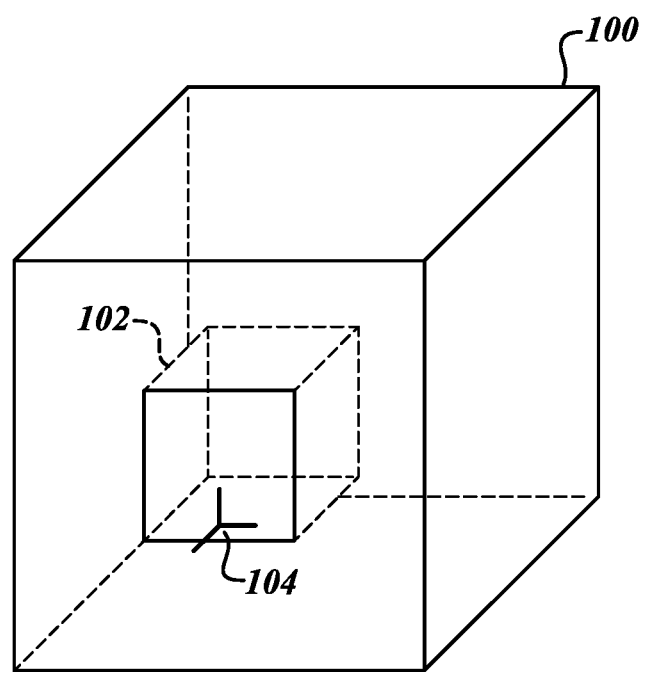
FIG. 1 illustrates a wearable or mobile device including at least one sensor and a reference frame fixed to the sensor, according to an embodiment of the present disclosure.

FIG. 1 illustrates a wearable or mobile device 100 including at least one sensor 102 and a reference frame (also referred to as a coordinate system) 104 associated with the sensor 102, according to an embodiment of the present disclosure. Alternatively, the reference frame 104 may be associated with the device 100. Although the reference frame 104 for the sake of the following discussion is illustrated as a cartesian coordinate system, the scope of the present disclosure covers all other types of coordinate systems, including non-orthogonal coordinate systems, in which vectors can be mathematically defined.

Figure 2:
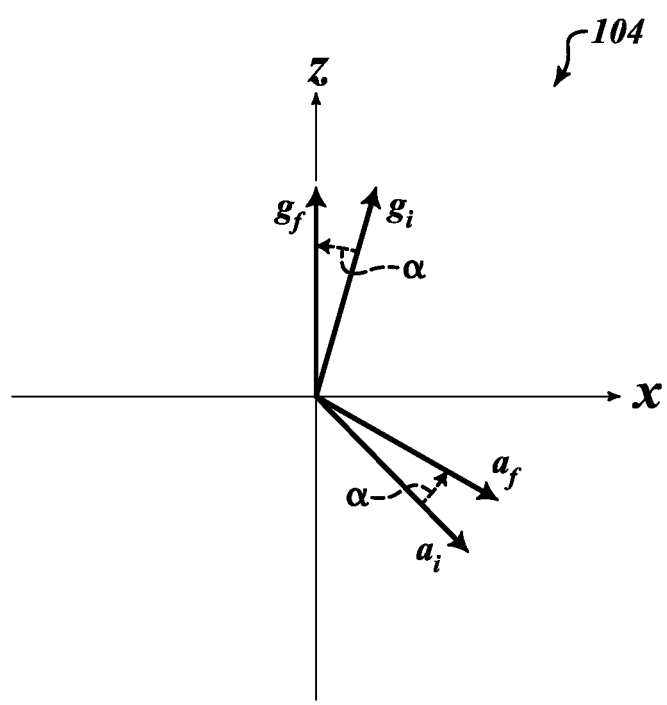
FIG. 2 illustrates the reference frame of FIG. 1, according to an embodiment of the present disclosure.

FIG. 2 illustrates the reference frame 104 of FIG. 1, according to an embodiment of the present disclosure. The reference frame 104 includes x, y and z axes that form a cartesian coordinate system. Assuming that the cartesian coordinates of a reference vector (i.e., the components of the reference vector), such as a gravitational vector $g_i$, $g_f$ as illustrated or any other reference vector such as a magnetic field vector of the earth, for example, is known to the device 100 or sensor 102 (via measurements of the reference field by the sensor 102 or via values of the reference field imported to the device from an external source, for example), as well as the magnitude of the reference vector, then the device 100 may determine the angle α (alpha) between the reference vector $g_i$ and any axis (such as the z axis, for example) via application of trigonometric functions, such as Arctan functions. The device 100 may then rotate the reference vector $g_i$ by (i.e., around) the angle alpha to align the vector $g_i$ along the axis, and become the reference vector $g_f$ as shown. Once the reference vector is rotated around the angle alpha, all other vectors generated by the sensor 102, vector a, being rotated to become vector of for example, will subsequently be rotated around the same angle alpha, thereby defining sensor data, as represented by the rotated vectors, with respect to the universal frame of reference that is itself defined with respect to the reference vector $g_f$.

FIG. 2 illustrates the gravitational reference vector $g_i$, $g_f$ to lie initially in the x-z plane for ease of description, however the scope of the embodiments of the present disclosure covers rotations of the reference vector (and subsequently the rotation of all other vectors generated by the sensor) from any initial orientation within the x-y-z coordinate system through any angle alpha, where the angle alpha is defined to be the angle between the reference vector any one of the x, y or z axes or any other axis defining a particular predefined orientation. Although the reference vector in the following embodiments is described to be rotated to align with the z-axis, the scope of the present description covers rotations of vectors to align with any of the three axes, or any axis, in positive or negative directions.

Figure 3:
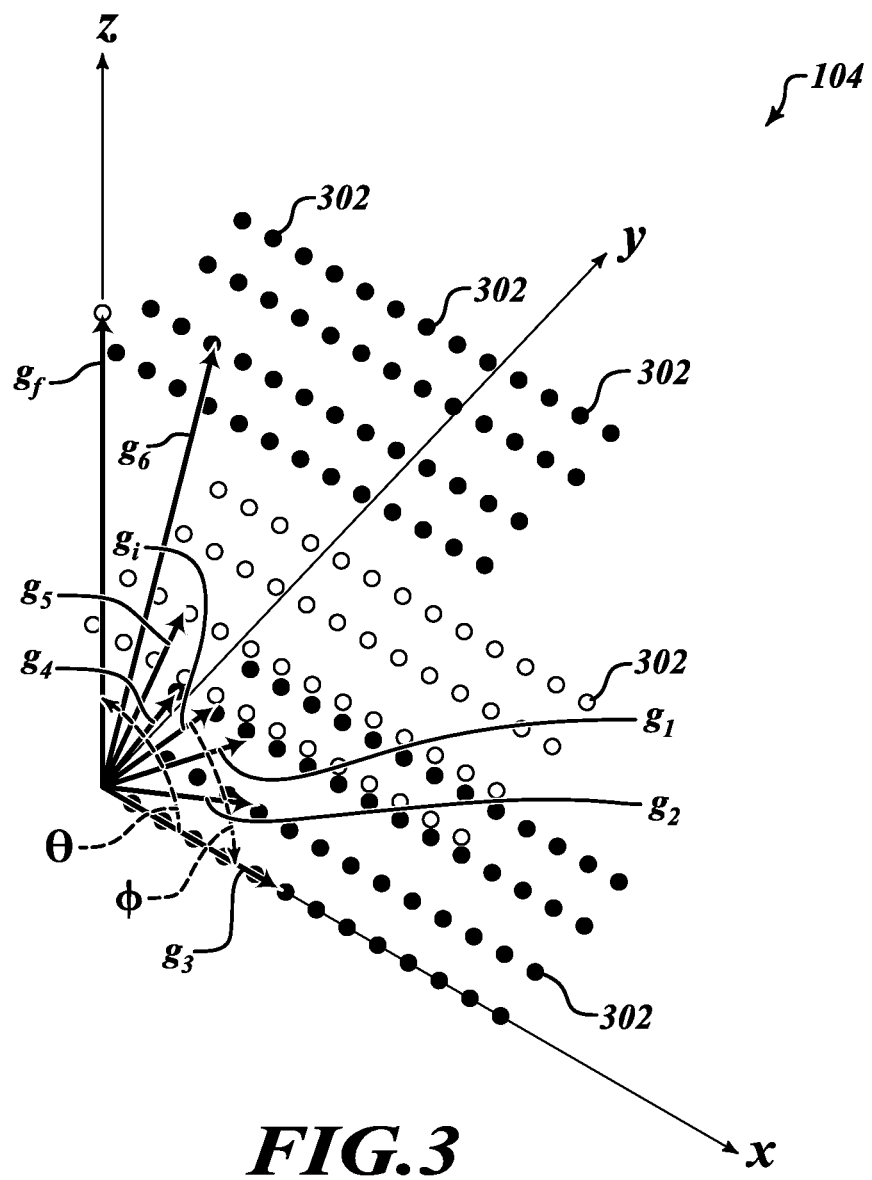
FIG. 3 illustrates a quantization of x-y-z space defined within the reference frame of FIG. 2, according to an embodiment of the present disclosure.

FIG. 3 illustrates a quantization of x-y-z space defined within the reference frame 104, according to an embodiment of the present disclosure. The device 100 or the sensor 102 includes processing circuitry, as discussed further below in conjunction with FIGS. 5 and 7, for enabling the rotation of a vector, for example the reference vector, from an initial vector $g_i$ to a final vector $g_f$ along any axis or in any direction, although the exemplary embodiment illustrates the rotated vector to be aligned along the z-axis.

According to one embodiment, a vector may only take one of the quantized vector positions as represented by the quantized points 302 in the x-y-z coordinate system 104 (also referred to as x-y-z space). For visual clarity, FIG. 3 shows some of the points 302 with solid circles and some with empty circles. The number of quantized vector positions is based upon the precision by which the x, y and z components of the vectors are represented, or in other words, the number of bits assigned to represent each of the components of the vector, as well as the maximum magnitude of a vector generated by the sensor 102 or used by the device 100.

Figure 4:
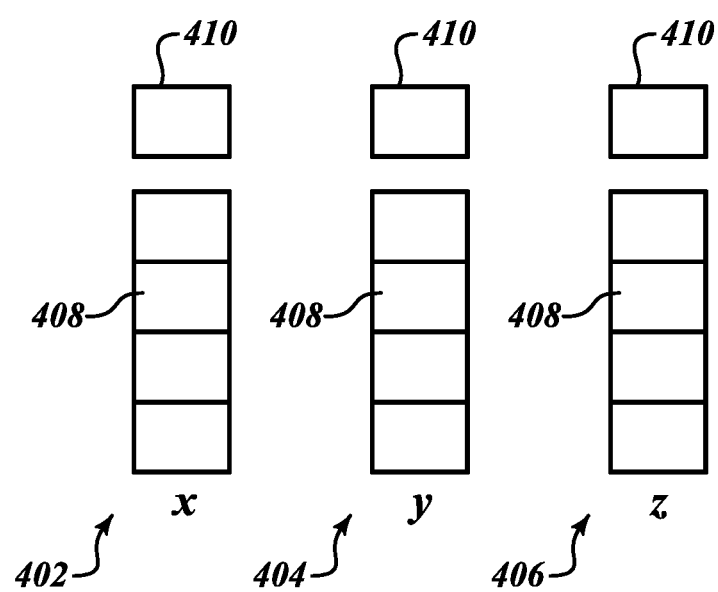
FIG. 4 illustrates a first register, a second register, and a third register for storing the binary representations of the x, y and z components of a vector, respectively, according to an embodiment of the present disclosure.

For example, FIG. 4 illustrates a first register 402, a second register 404, and third register 406 for storing the binary representations of the x, y and z components of a vector, respectively, according to an embodiment of the present disclosure. For example, the first register 402, the second register 404, and the third register 406 may store, respectively, the x, y, z components of the reference gravitational vector g. In the embodiment illustrated, each register has n+1 bits, with n bits 408 used to represent the respective (scalar) component of the vector, and a sign bit 410 to represent a sign of the respective scalar component. Thus, each of the quantized x, y and y components of the vector may be represented by one of $2^{**(n-1)}-1$ integer values, or in this particular embodiment with n=4, by one of 31 integer values represented by the integer set {−15, −14, . . . −1, 0, 1, . . . 14, 15}. The density of quantized points 302 in the x-y-z space representing quantized vectors also depends upon the maximum magnitude of the vector being used by the device 100 or generated by the sensor 102. That is, it may be determined, based upon the number of bits n used to represent the respective components and a maximum magnitude of a vector generated or used by the device 100, the density of quantized points within the x-y-z space (i.e., the location of each quantized point in the space). The extent of the x-y-z space may be defined to be the minimum space required for representing vectors that have a magnitude equal to or less than a predetermined maximum. Once the density of quantized points is known in the x-y-z-space, then all the incremental angles of rotation between any two quantized vectors is also known, including the smallest incremental angle for rotating any given quantized vector to a nearest quantized vector.

In one embodiment, and referring again to FIG. 3, the system 100 rotates the initial vector $g_i$ (having polar angle θ (theta) and azimuthal angle Φ (phi)) to a final vector orientation $g_f$ that is in alignment with the z-axis. The initial vector $g_i$ is first incrementally rotated around phi, from $g_i$ to $g_1$, from $g_1$ to $g_2$, and from $g_2$ to $g_3$, where the selection of the sequence of quantized vectors $g_1$, $g_2$ and $g_3$ is based upon selecting the smallest phi rotational angles between each pair of quantized vectors (i.e., $(g_i,g_1)$, $(g_1,g_2)$, $(g_2,g_3)$) in the sequence of quantized vectors. The incremental rotation of the vector $g_i$ around phi is stopped once the vector is rotated through the azimuthal angle phi, or in other words, once the vector $g_i$ is completely rotated around the azimuthal angle phi such that the vector $g_i$ is located on the x-z plane (i.e., as intermediate vector $g_3$).

Then, the system 100 rotates the vector $g_3$ around the polar angle theta by incrementally rotating the vector $g_3$ through a sequence of quantized vectors (not shown) positioned on the x-z plane, based upon selecting the smallest theta rotational angles between each pair of quantized vectors in the sequence of intermediate quantized vectors on the x-z plane, until the vector $g_3$ is rotated to be aligned with the z-axis (i.e. as final vector $g_f$).

In one embodiment, the smallest phi rotational angle between each pair of vectors in the sequence of incrementally rotated vectors may be approximately represented by an integer multiple of an elemental phi rotational angle, referred to as $phi_e$. For illustration purposes using an exemplary embodiment, the smallest phi rotational angle between a first pair of vectors (e.g., $g_i$, $g_1$) in the sequence of incrementally rotated vectors may be $2phi_e$, the smallest phi rotational angle between a second pair of vectors (e.g., $g_1$, $g_2$) in the sequence of incrementally rotated vectors may be $3phi_e$, and the smallest phi rotational angle between the third pair of vectors (e.g., $g_2$, $g_3$) in the sequence of incrementally rotated vectors may be $phi_e$. The value of $phi_e$, being based upon the density of quantized points in the x-y-z space, may be predetermined. In a similar fashion, the smallest theta rotational angle between each pair of vectors in the sequence of incrementally rotated vectors in the rotation of the vector $g_3$ around theta may be approximately represented by an integer multiple of an elemental theta rotational angle, referred to as $theta_e$, and may be predetermined or predefined based upon the density of quantized points in the x-y-z space.

As illustrated, the initial vector $g_i$ is incrementally rotated clockwise (CW) around phi (i.e., towards the x-z plane when the x-y plane is viewed along the z axis, or in other words, in a minus z direction using then right-hand rule of y cross x), however, alternatively, the vector $g_i$ may be incrementally rotated counterclockwise (CCW) around phi (i.e. towards the y-z plane, in other words, in a positive z direction using the right-hand rule of x cross y), until the vector $g_i$ is located on the y-z plane as vector $g_4$, at which point the vector $g_4$ is incrementally rotated around the angle theta via quantized vectors $g_5$ and $g_6$ until the original vector $g_i$ aligns along the z axis as $g_r$. The result of incrementally rotating the vector $g_i$ CCW first around phi and then CCW around theta is the same as the result of incrementally rotating the vector $g_i$ CW first around phi and then CW around theta, (i.e., either rotational path results in the final vector $g_f$.)

In one embodiment, the system 100 or a user of the system may choose either a CW or a CCW rotation for rotating the vector $g_i$ to the x-z or the y-z plane. The system 100 or the user may also choose either a CW or a CCW rotation for incrementally rotating the vector $g_i$ (once incrementally rotated to either the x-z or the y-z plane) about theta to align along the z-axis. In another embodiment, the system 100 selects the direction (i.e., sense) of rotation CW or CCW around phi and the sense of rotation CW or CCW around theta based on the fewest number of incremental rotations for aligning the initial vector $g_i$ along the z axis, or along any given axis.

Alternative to rotating the vector $g_i$ first around phi and then subsequently around theta, as described above, the vector $g_i$ may be first rotated around theta, and then subsequently around phi in order to align the vector $g_i$ with the z-axis. The choice between these two rotational paths is arbitrary, since the results are the same (i.e., the vector $g_i$ is rotated to be aligned with the z-axis, or in other embodiments, with any axis and in any direction with respect to any axis).

Figure 5:
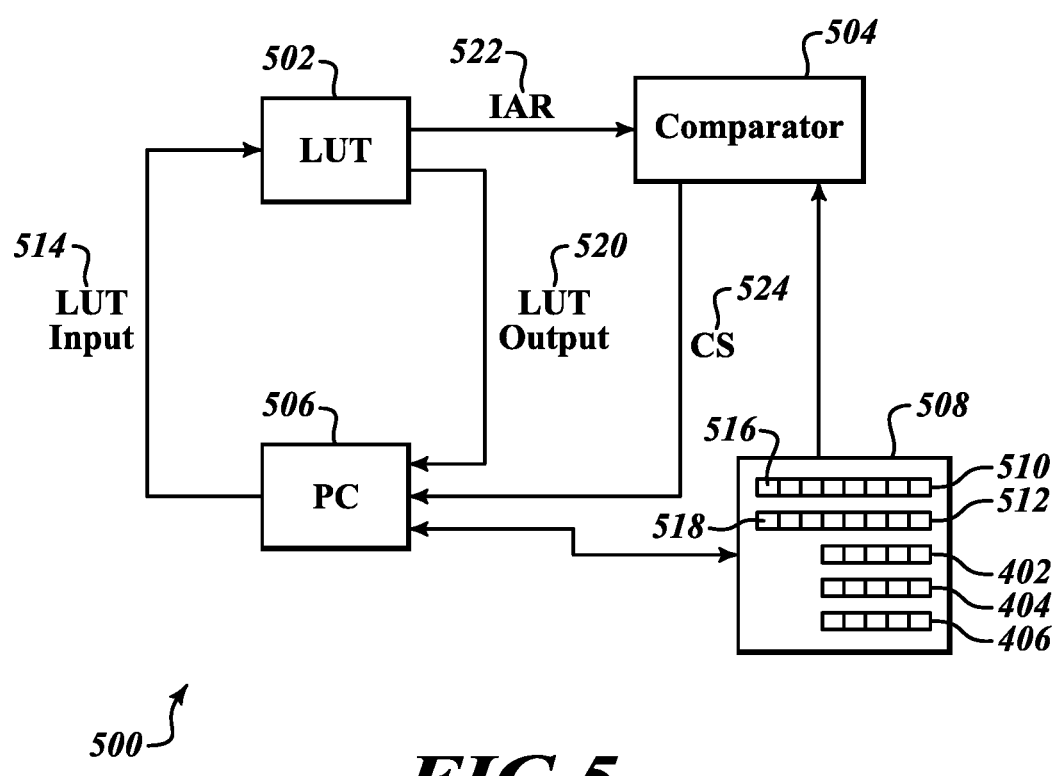
FIG. 5 illustrates a system for performing a low-power rotation of a vector, according to an embodiment of the present disclosure.

FIG. 5 illustrates a system 500 for performing a low-power rotation of a vector, according to an embodiment of the present disclosure. The system may be incorporated as part of the sensor 102 or the device 100, or elements of the system may be distributed between the sensor 102 and the device 100. The system 500 includes a lookup table (LUT) 502, a comparator 504, and processing circuitry 506. The LUT 502 may be all or part of a storage device, such as a random access memory (RAM), a Flash EPROM, an EEPROM, etc. The processing circuitry 506 may be a conventional microprocessor, for example.

The system 500 optionally includes a register unit 508 including the registers 402, 404 and 406 of FIG. 4 for storing the x, y and y components, respectively, of a reference vector or any other non-reference vector to be rotated, a first angle register 510 for storing a value of a first angle (e.g., a value of the angle theta or the angle phi around which the vector is to be rotated), and a second angle register 512 for storing a value of a second angle (e.g., a value of the other angle theta or phi around which the vector is to be rotated). In another embodiment, the processing circuitry 506 includes one or more of the registers of the register unit 508, and in yet another embodiment, one or more of the registers of the register unit 508 may be in a memory (not shown) external to the system 500, to which the system 500 is communicatively coupled.

Figure 6:
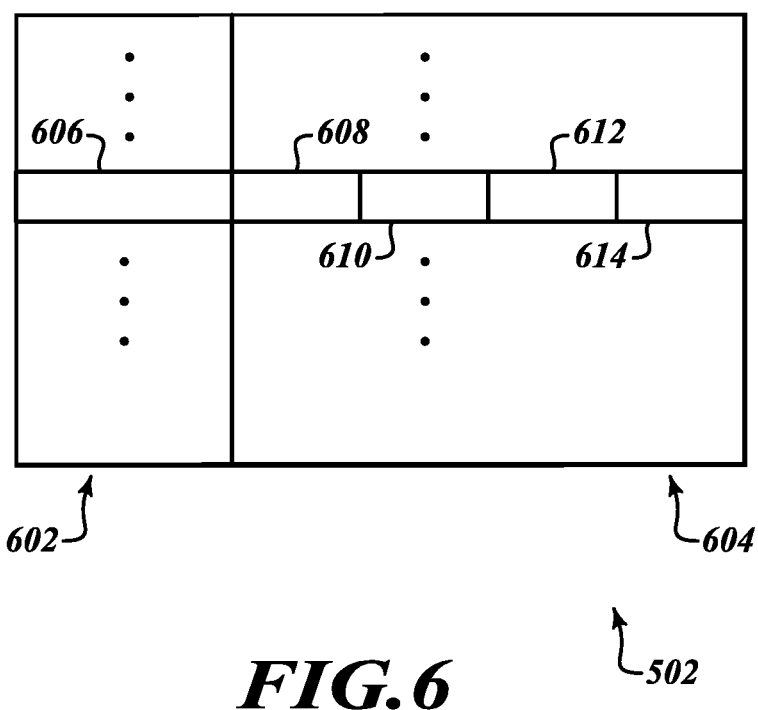
FIG. 6 illustrates the LUT of FIG. 5, according to an embodiment of the present disclosure.

Before describing operation of the system 500, reference is made to FIG. 6, illustrating the LUT 502 of FIG. 5, according to one embodiment of the present disclosure. The LUT 502 includes an input sector 602 and an output sector 604. The input sector 602 includes LUT input entries corresponding to combinations of quantized x, y and z components that represent all quantized vectors in the x-y-z space. In other words, each input entry corresponds to a different quantized vector in x-y-z space. If each component of the quantized vector is represented by n binary digits plus one binary digit for the sign, and when none of the entries is permitted to have a value of zero, then the input sector 602 of the LUT 502 will have $2^{}(3(n+1)-1)$ entries. If the sign bit is processed separately, then the number of input entries is $2^{}(3n-1)$, which for n=4 is 2048 entries.

The output sector 604 includes LUT output entries. The LUT 502 is configured such that each LUT input entry, for example LUT input entry 606, has four corresponding LUT output entries, for example LUT output entries 608, 610, 612, 614, where each of the four LUT output entries includes an LUT output representing the quantized x, y, z components of an incrementally rotated quantized vector and an incremental angular rotation (IAR) representing the angle between the quantized vector (represented by the corresponding LUT input entry) and the incrementally rotated quantized vector. In one embodiment, the IAR is represented by an integer.

For example, the LUT output entry 608 corresponding to the LUT input entry 606 represents rotational results when the corresponding input vector represented by the LUT input entry 606 is incrementally rotated around theta in a clockwise sense (CW) to a closest neighboring quantized vector (i.e., rotated through the smallest possible rotational angle, represented by a product of an integer and the elemental theta rotational angle $theta_e$). The LUT output entry 610 corresponding to the particular LUT input entry 606 represents rotational results when the corresponding input vector represented by the particular LUT input entry 606 is rotated incrementally around theta in a counterclockwise sense (CCW) to a closest neighboring quantized vector (i.e., rotated through the smallest possible rotational angle, represented by a product of a second integer and the elemental theta rotational angle $theta_e$). The LUT output entry 612 corresponding to the particular LUT input entry 606 represents rotational results when the corresponding input vector represented by the particular LUT input entry 606 is rotated incrementally around phi in a clockwise sense (CW) to a next closest quantized vector (i.e., rotated through the smallest possible rotational angle, represented by a product of a third integer and the elemental phi rotational angle $phi_e$). The LUT output entry 614 corresponding to the particular LUT input entry 606 represents rotational results when the corresponding input vector represented by the particular LUT input entry 606 is rotated incrementally around phi in a counterclockwise sense (CCW) to a next closest quantized vector (i.e., rotated through the smallest possible rotational angle, represented by a product of a fourth integer and the elemental phi rotational angle $phi_e$).

Referring again to FIG. 5, the processing circuitry 506 is configured to access the LUT 502 with a LUT input 514 for identifying a LUT input entry of the input sector 602 that matches the LUT input 514, and then selecting one of the four LUT output entries corresponding to the identified LUT input entry.

Upon startup of the system, the processing circuitry 506 is configured to set counters, such as any counters used by the comparator 504 (e.g., see FIG. 9) to their initial values (e.g., zero), receive the signed components of a vector (e.g., reference vector which is to be rotated to align with a predetermined axis, such as the z-axis), optionally determine which of the two angles (e.g., theta or phi) around which to first rotate the vector, determine the values of the first and second angles around which to rotate the vector and the senses of rotation (CW or CCW) around each of the first and second angles, and generate an LUT input based on the received signed components of the vector.

The processing circuitry 506 may store the value of one of the first angle and the second angle, along with the corresponding determined sense of rotation, in the first angle register 510, and the value of the other of the first angle and second angle, along with the corresponding determined sense of rotation, in the second angle register 512, depending upon which angle is selected to first rotate the vector around. In one embodiment, the angle around which to first rotate the vector is arbitrary. In one embodiment, the sense of rotation around each of the two angles may be represented by a rotation sign bit, for example, a first rotation sign bit 516 and a second rotation sign bit 518. In another embodiment, the processing circuitry 506 receives the signed components of the vector from the first, second and third component registers 402, 404, and 406 of the register unit 508.

In one embodiment, the selection of a first angle (e.g., theta or phi) around which to first rotate the vector and a second angle (e.g., the other of theta or phi) around which to further rotate the vector after the first rotation is complete, is either arbitrary or user defined. In another embodiment, the processing circuitry 506 determines the values of the selected angles around which to rotate the vector based on the received signed components of the vector (e.g., based upon trigonometric functions applied to the signed components and the axis or direction to which the vector is to be rotated or aligned). In a further embodiment, the determination of the sense of rotation (a first sense or a second sense, or in one embodiment, CW or CCW) around one or more of the first and second angles is either arbitrary or user defined. In one embodiment, the sense of rotation is based on the values of the selected angles around which to rotate the vector, which are further based on the received signed components of the vector. However, in another embodiment, the processing circuitry 506 determines the sense of rotation around the first and second angles based on minimizing the total number of incremental angular rotations for rotating the vector to align with an axis or be oriented in any given predefined or user defined direction.

In one embodiment, the processing circuitry 506 generates the LUT input, e.g., LUT input 514, based on the received signed components of the vector. For example, the LUT input 514 may be a string of bits that represents the signed x, y, z components of the vector, such as a reference vector. In this embodiment, each LUT input entry of the input sector 602 may also represent a unique combination of quantized x, y, z components via a string of bits, in which three of the bits indicate signs of the respective component. In another embodiment, the LUT input 514 may be a string of bits that represents the unsigned x, y, z components of the vector, and the bits 410 representing the sign of each component is processed separately. In another embodiment, an external processor or an upstream component of the system 500, such as bit processors and/or filters (not shown) generate the LUT input. In this embodiment, the processing circuitry 506 receives the initial LUT input from the external source. The external source may generate the LUT input based upon signals generated by, and received from, the sensor 102. The signals may be generated by accelerometers or gyroscopes, or other types of sensing devices, for example.

Upon receiving or generating the LUT input, e.g., LUT input 514, the processing circuitry 506 accesses the LUT 502 with the LUT input, and identifies an LUT input entry, e.g., LUT input entry 606, that matches the LUT input 514. Then using additional information, such as the first angle around which the vector is to be rotated and/or the directional sense of rotation around the first angle, the processing circuitry 506 selects the LUT output entry, e.g., LUT output entry 612, that corresponds to the identified LUT input entry and matches the criteria of the additional information. An LUT output entry, e.g., LUT output entry 612, includes a LUT output, e.g., LUT output 520, having a string of bits representing the signed x, y, z components of the incrementally rotated quantized vector, and an incremental angular rotation, e.g., IAR 522, representing the angle between the quantized vector (represented by the corresponding LUT input entry 606) and the incrementally rotated quantized vector (represented by the LUT output 520). In one embodiment, the IAR 522 is an integer. The product of the integer IAR 522 and the predefined elemental rotational angle of the first angle represents the smallest rotational angle for rotating the quantized vector (represented by the corresponding LUT input entry 606) in the determined sense of rotation around the first angle.

The processing circuitry 506 receives or accesses the LUT output 520 and the comparator 506 receives or accesses the IAR 522. In one embodiment, the comparator 504 includes a counter (described further below in conjunction with FIG. 9) that is set equal to zero by the processing circuitry 506 upon startup. The comparator 504 adds the IAR 522 to the counter (i.e., increments the counter), compares the counter to the value of the first angle, and makes accessible or sends a comparator signal CS 524 to the processing circuitry 506. If the CS 524 indicates to the processing circuitry 506 that the value of the first angle is not equal to the counter, the processing circuitry accesses the LUT 502 using the LUT output 520 as a next LUT input for identifying a next LUT input entry that matches the next LUT input. The processing circuitry iteratively repeats accessing the LUT 502 for incrementally rotating the vector around the first angle until the CS 524 indicates to the processing circuitry 506 that the value of the first angle is equal to the counter, thereby indicating that the vector has been fully rotated around the first angle to an intermediate vector. The LUT output 520 upon the last iteration of accessing the LUT 502 represents the signed x, y, z intermediate components of the intermediate vector.

Upon receiving the CS 524 indicating that the vector has been fully rotated around the first angle, the processing circuitry 506 sets the counter of the comparator 504 to zero, and generates the LUT input 514 based on the signed x, y, z intermediate components of the intermediate vector. The processing circuitry 506 then iteratively repeats the above-described process of rotating the vector around the first angle for rotating the intermediate vector around the second angle in the determined sense around the second angle until the CS 524 indicates that the counter is equal to the value of the second angle, thereby indicating that the intermediate vector is rotated fully around the second angle for generating a final vector having final components. That is, the system 500 is configured to rotate the vector to a final vector that is aligned with a predefined axis or orientation by rotating the vector around the first angle for generating the intermediate vector, and rotating the intermediate vector around the second angle for generating the final vector, where the quantized final components of the final vector are represented by the LUT output 520 on a final iteration of accessing the LUT 502.

Once the system 500 determines the first and second angles for rotating a reference vector, the system 500 is configured to rotate any vector around the first and second angles using the above-described procedure.

Figure 7:
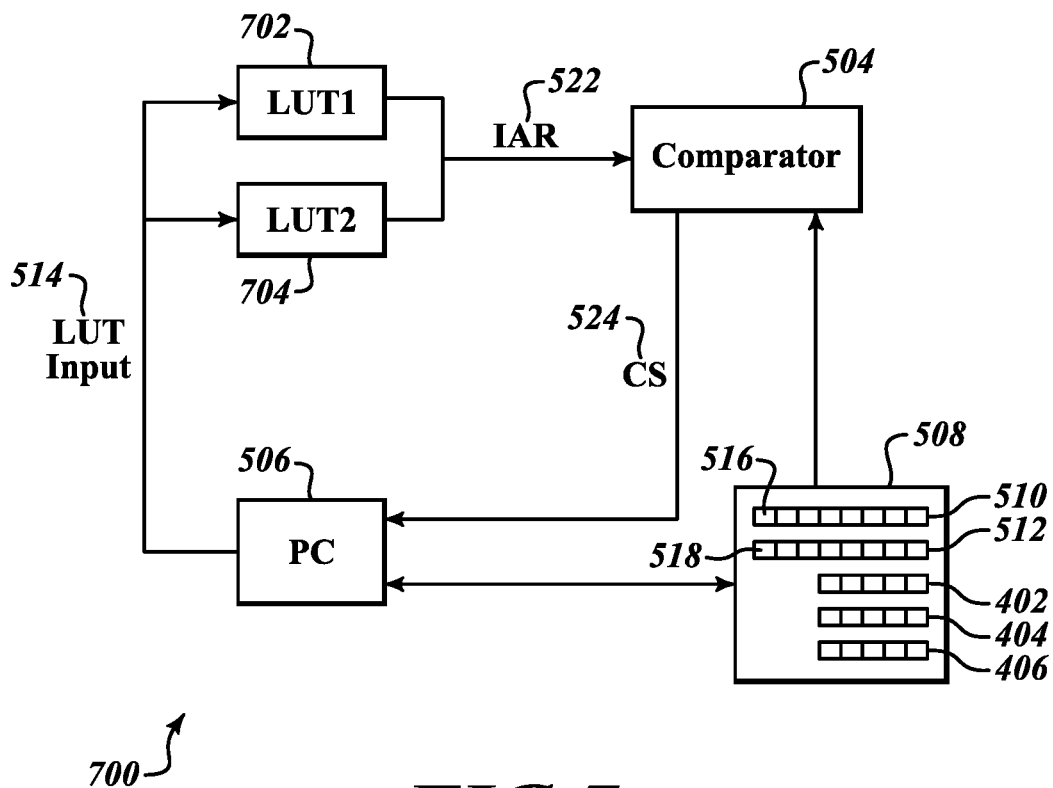
FIG. 7 illustrates a system for performing a low-power rotation of a vector, according to an embodiment of the present disclosure.

FIG. 7 illustrates a system 700 for performing a low-power rotation of a vector, according to another embodiment of the present disclosure. The system 700 may be incorporated as part of the sensor 102 or the device 100, or elements of the system may be distributed between the sensor 102 and the device 100. Components of the system 700 that have the same reference numbers of the system 500 as illustrated by FIG. 5 are the same and will not be discussed more in detail. The system 700 includes two lookup tables, a first LUT 702 and a second LUT 704, in contrast to the single LUT 502 of the FIG. 5 embodiment, and the processing circuitry 506 does not receive or access a LUT output, in contrast to the FIG. 5 embodiment. The first LUT 702 includes data corresponding to the vector being rotated around a first angle associated with the first LUT and a second LUT includes data corresponding to the vector being rotated around a second angle associated with the second LUT.

Figure 8:
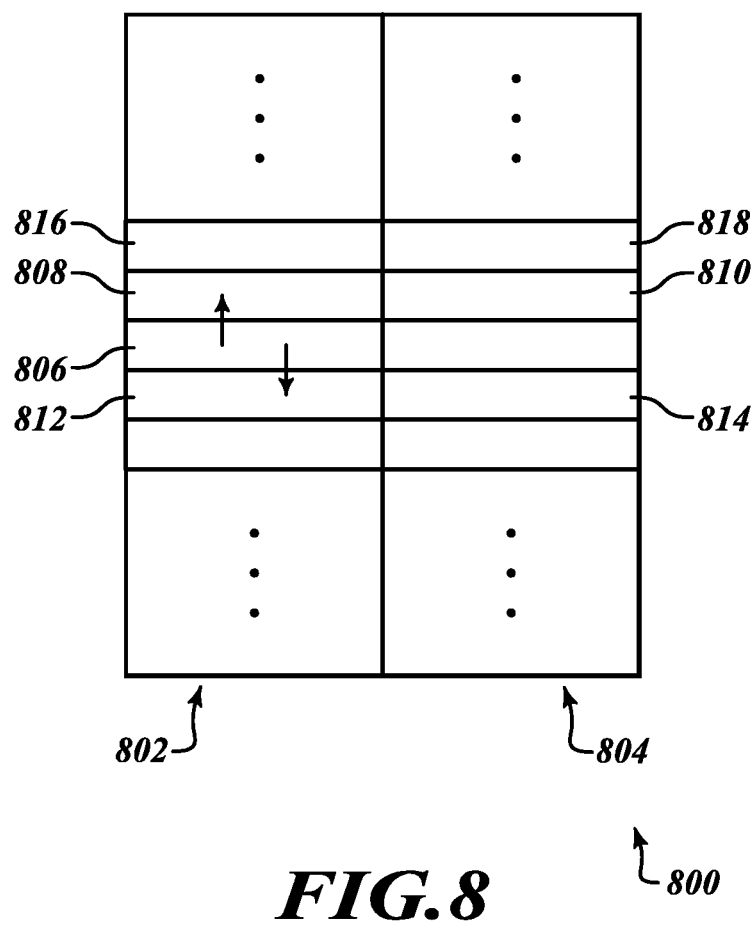
FIG. 8 illustrates the LUT of FIG. 7, according to an embodiment of the present disclosure.

Before describing the operation of the system 700, reference is made to FIG. 8, illustrating a LUT 800, according to an embodiment of the present disclosure. The LUT 800 represents an embodiment of the first LUT 702 and the second LUT 704 of FIG. 7.

The LUT 800 includes an input sector 802 and an output sector 804. The input sector 802 includes LUT input entries corresponding to combinations of x, y and z components that represent all quantized vectors in the x-y-z space. However, the LUT 800 is configured such that for a given LUT input entry, for example entry 806 representing a quantized vector, a rotation of the vector about the angle associated with the LUT 800 (i.e., the first angle or the second angle) in a first sense of rotation around the angle corresponds to moving in a first direction in the input sector 802 to a first adjacent LUT input entry 808, which represents the quantized components of the rotated vector, and the corresponding LUT output entry 810 includes the incremental angular rotation (between the vector and the rotated vector) in the first sense of rotation. Of course, this is also the incremental angular rotation from 808 to 806 in the opposite sense of rotation, as the sense of rotation is encoded by the shifting direction along the table. Furthermore, a rotation of the vector around the angle associated with the LUT 800 in a second sense of rotation around the angle, opposite the first sense, corresponds to moving in a second direction (opposite the first direction) in the input sector 802 to a second adjacent LUT input entry 812, which represents the quantized components of a second rotated vector, and the corresponding LUT output entry 814 includes the incremental angular rotation (between the vector and the second rotated vector) in the second sense of rotation. The sense of rotation is thus encoded by the direction of movement in the input sector 802 of the LUT 800.

In one embodiment, the incremental angular rotation of the vector represented by an input entry, e.g., input entry 806, to a vector represented by adjacent input entries 808 or 812, is the smallest incremental rotation of the vector around the angle associated with the LUT 800 in the respective first and second senses of rotation. As described above in conjunction with FIGS. 5 and 6, the first sense of rotation around an angle may be CW or CWW and the second sense of rotation around an angle may be CW or CCW. In an embodiment, the incremental angular rotation IAR 522 of the vector about an angle may be the product of an integer and the predefined elemental rotational angle of the angle, and in another embodiment, the IAR 522 may itself be the integer.

Referring again to FIG. 7, the startup and initialization of the system 700 is identical to the startup and initialization of the system 500 of FIG. 5. However, after generation of the LUT input 514 based upon the signed components of the vector to be rotated, the processing circuitry 506 accesses the first LUT 702 with the LUT input 514, and identifies an LUT input entry, e.g., LUT input entry 806, that matches the LUT input 514. Then using additional information, such as the determined sense of the rotation around the first angle, the processing circuitry 506 identifies one of two LUT input entries (e.g., 808, 812) adjacent to the identified LUT input entry based upon the determined sense of rotation around the first angle, and selects an LUT output entry (e.g., 810, 814) corresponding to the identified one of two adjacent LUT input entries. The LUT output entry represents an incremental angular rotation (e.g., IAR 522) of the vector around the first angle in the determined sense of rotation.

The comparator 504 receives the IAR 522, and as in the FIGS. 5 and 6 embodiments, generates and sends the CS 524 to the processing circuitry 506. If the CS 524 does not indicate that the counter is equal to the value of the first angle, then the processing circuitry 506 moves either in the first direction or the second (opposite) direction in the LUT input sector 802, depending upon the determined sense of rotation, from the previous identified one of two LUT input entries for identifying a next adjacent input entry. In one embodiment, the processing circuitry does not send another LUT input 514 to the first LUT 702, but instead increments a memory location associated with the previous identified one of two LUT input entries to the next higher adjacent or next lower adjacent memory location for identifying the next adjacent input entry. For example, assuming that the previous identified one of two LUT input entries is input entry 808, then the processing circuitry 506 identifies LUT input entry 816 as a next adjacent LUT input entry, and selects the LUT output entry 818 corresponding to the identified LUT input entry 816 as a next LUT output entry, representing the incremental angular rotation (e.g., IAR 522) of the vector around the first angle in the determined sense of rotation (i.e., representing the incremental angular rotation between the vector represented by the LUT input entry 808 and the vector represented by the LUT input entry 816).

The processing unit 506 iteratively repeats accessing the first LUT as described above until the CS 524 indicates to the processing circuitry that the counter is equal to the value of the first angle, further indicating that the vector is rotated fully around the first angle to an intermediate vector having signed intermediate components. The processing unit 506 then sets the total incremental angular rotation counter to zero, and accesses the second LUT 704 with a LUT input representing the signed intermediate components of the intermediate vector, using the same process as described above for accessing the first LUT 702, for rotating the intermediate vector in the determined sense of rotation around the second angle for generating a final vector. That is, the system 700 rotates the vector to a final vector that is aligned with a predefined axis or orientation by rotating the vector around the first angle for generating the intermediate vector, and rotating the intermediate vector around the second angle for generating the final vector, where the quantized final components of the final vector are represented by a last adjacent LUT input entry resulting from a final iteration.

Figure 9:
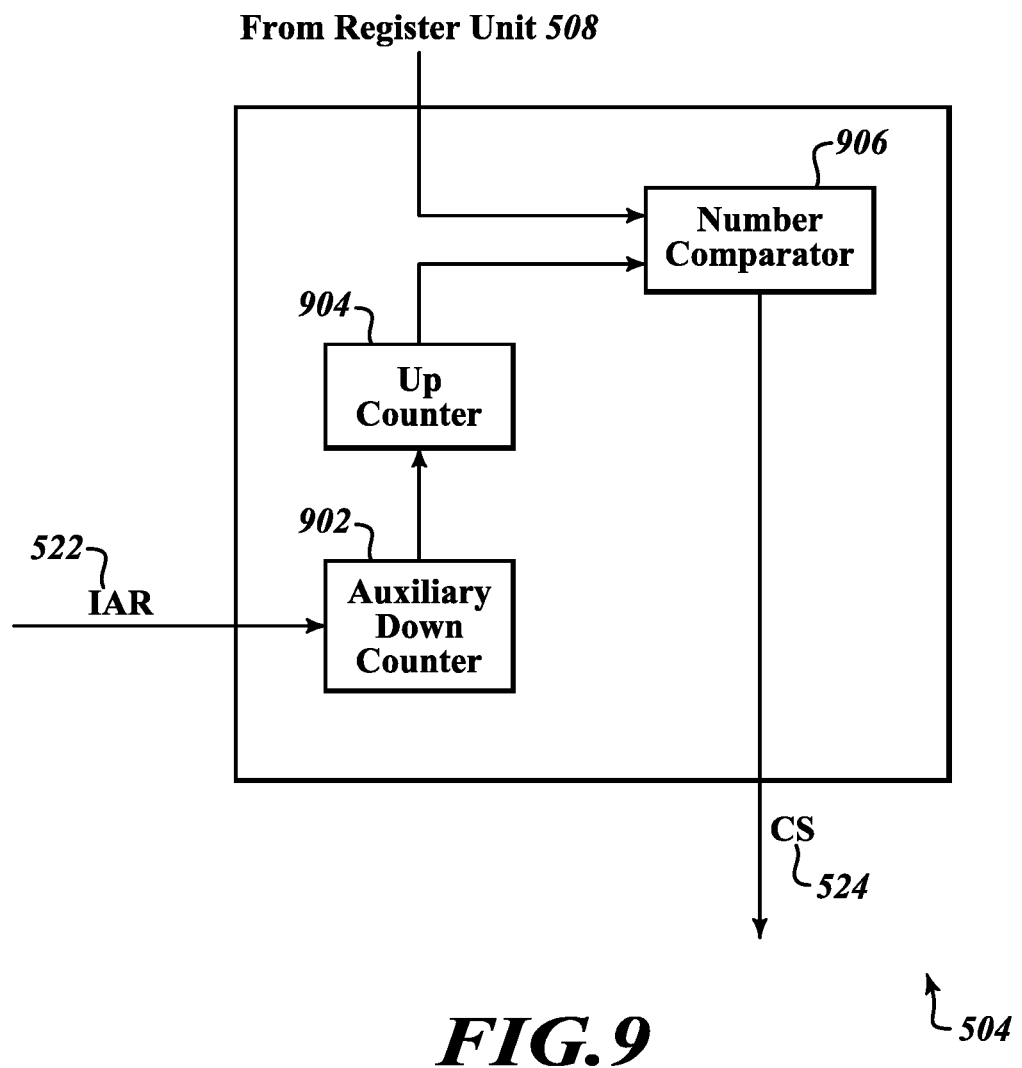
FIG. 9 illustrates the comparator of FIGS. 5 and 7, according to an embodiment of the present disclosure.

FIG. 9 illustrates the comparator 504 of FIGS. 5 and 7, according to an embodiment of the present disclosure. As illustrated, the comparator 504 includes an auxiliary down counter 902, an up counter 904 and a number comparator 906.

The auxiliary down counter 902 is configured to receive the IAR 522. In one embodiment, the IAR 522 is an integer representing an incremental angular rotation of a vector around either a first angle or a second angle in either a first sense of rotation or a second sense of rotation. The auxiliary down counter 902 may be formed from, for example, flip flop circuitry (not shown) that is configured to receive a clock signal (not shown) and decrement (e.g., by one) the received IAR 522 upon reception of the clock signal until a threshold value is reached, for example zero. The auxiliary down counter 902 is also configured to send an up-count signal to the up counter 904 every time the auxiliary down counter 902 decrements the received IAR 522. The up counter 904 may also be formed from flip flop circuitry that is configured to store a total incremental angular rotation counter, increment the total incremental angular rotation counter (e.g., by one) upon every reception of the up-count signal, and send the total incremental angular rotation counter to the number comparator 906.

The number comparator 906 may be formed from logic gates, such as AND gates, OR gates, NOR gates, and/or inverters, for example. Number comparators are well known in the art and will not be discussed in more detail. In operation, the number comparator 906 is configured to receive the value of the angle from one of the angle registers 510, 512 around which the vector is being rotated, receive the total incremental angular rotation counter from the up counter 904, and generate the comparator signal CS 524 based on a comparison of the value of the angle from one of the angle registers 510, 512 with the total incremental angular rotation counter. The comparator 504 then sends the CS 524 to the processing circuitry 506. For example, in one embodiment, the CS 524 is at a logic low when the value of the angle from one of the angle registers 510, 512 is not equal to the total incremental angular rotation counter, and is at a logic high when the value of the angle from one of the angle registers 510, 512 is equal to the total incremental angular rotation counter.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for rotating an initial vector using two lookup tables (LUTs), a first LUT including data corresponding to vector rotations around a first angle associated with the first LUT, and a second LUT including data corresponding to vector rotations around a second angle associated with the second LUT, each LUT having LUT input entries and LUT output entries, and the vector having signed components, for use in an electronic device, the method comprising:
   (a) determining a value of the first angle associated with the first LUT around which to rotate the initial vector, a sense of rotation around the first angle, a value of the second angle associated with the second LUT around which to rotate an intermediate vector, and a sense of rotation around the second angle, the determining based on the signed components of the initial vector;
   (b) setting a total incremental angular rotation counter to zero;
   (c) identifying a LUT input entry of the first LUT matching a LUT input that represents the signed components of the initial vector;
   (d) identifying one of two LUT input entries adjacent to the identified LUT input entry based upon the determined sense of rotation around the first angle, and selecting an LUT output entry corresponding to the identified one of two adjacent LUT input entries, the LUT output entry representing an incremental angular rotation of the initial vector around the first angle;
   (e) incrementing the total incremental angular rotation counter by the incremental angular rotation, comparing the total incremental angular rotation counter with the value of the first angle around which the initial vector is being rotated, and generating a comparator signal based upon the comparison;
   (f) based on the comparator signal, iteratively repeating (d) to (e) for rotating the initial vector until the total incremental angular rotation counter value is equal to the value of the first angle and the initial vector is rotated around the first angle, thereby forming the intermediate vector having signed intermediate components, wherein the identified one of two adjacent LUT input entries of step (d) in a current iteration is used as the identified LUT input entry of step (d) in a next iteration of steps (d) to (e);

(g) setting the total incremental angular rotation counter to zero;

(h) identifying a LUT input entry of the second LUT matching the identified one of two adjacent LUT input entries of step (d) in a last iteration of steps (d) to (e), the identified LUT input of the second LUT representing the signed intermediate components of the intermediate vector;

(i) identifying one of two LUT input entries of the second LUT adjacent to the identified LUT input entry of the second LUT based upon the determined sense of rotation around the second angle, and selecting the LUT output entry corresponding to the identified one of two adjacent LUT input entries, the LUT output entry representing an incremental angular rotation of the intermediate vector around the second angle;

(j) incrementing the total incremental angular rotation counter by the incremental angular rotation around the second angle, comparing the total incremental angular rotation counter with the value of the second angle around which the intermediate vector is being rotated, and generating a second comparator signal based upon the comparison;

(k) based on the second comparator signal, iteratively repeating (i) to (j) for rotating the intermediate vector until the total incremental angular rotation counter value is equal to the value of the second angle and the intermediate vector is rotated around the second angle, thereby forming a final vector having signed final components, wherein the identified one of two adjacent LUT input entries of step (i) in a current iteration is used as the identified LUT input entry of step (i) in a next iteration of steps (i) to (j); and (l) generating an indication of an orientation of the electronic device in a reference frame based on the final vector.

2. The method of claim 1, further comprising:
receiving the signed components of the initial vector; and
generating the LUT input that represents the signed components of the initial vector based on the received signed components of the initial vector.

3. The method of claim 1, wherein the signed components of the initial vector are measured with respect to a first coordinate system fixed to a mobile device having a sensor, and the initial vector is rotated to a second coordinate system defined with respect to a universal standard.

4. The method of claim 3, wherein the universal standard is a gravitational field or a magnetic field of the earth.

5. The method of claim 3, wherein the initial vector is a reference vector or a motion vector generated by the sensor.

6. The method of claim 5, wherein the reference vector is a gravitational field vector of the earth or a magnetic field vector of the earth, and the motion vector is an acceleration vector generated by the sensor.

7. The method of claim 1, wherein determining the value of the first angle and the second angle around which to rotate the initial vector is based on one or more trigonometric relationships between the signed components of the initial vector.

8. The method of claim 1, wherein the initial vector is rotated around the value of the angle associated with the first LUT and the value of the angle associated with the second LUT for aligning the initial vector with a coordinate axis, and wherein the determined sense of rotation around the first angle associated with the first LUT and the determined sense of rotation around the second angle associated with the second LUT is based on minimizing a number of incremental angular rotations of the initial vector for aligning the initial vector.

9. The method of claim 1, wherein the signed components of the initial vector include a signed x component, a signed y component and a signed z component, wherein the first angle associated with the first LUT is one of a polar angle and an azimuthal angle, and the second angle associated with the second LUT is the other of the polar angle and the azimuthal angle, and wherein the rotation about the azimuthal angle results in the initial vector being rotated to one of two planes orthogonal to each other, and rotation around the polar angle aligns the initial vector with one of an x, y and z axis.

10. The method of claim 1, wherein each LUT input entry of each LUT includes quantized signed x, y and z components of the initial vector, and a first adjacent LUT input entry includes quantized signed x, y and z components corresponding to a smallest incremental angular rotation of the initial vector in a first sense around the associated angle and a second adjacent LUT input entry includes quantized signed x, y and z components corresponding to a smallest incremental angular rotation of the initial vector in a second sense around the associated angle, the second sense opposite the first sense.

11. The method of claim 1, wherein each incremental angular rotation of the initial vector around the first angle associated with the first LUT is a product of a first integer and a first predefined elemental rotational angle, and each incremental angular rotation of the intermediate vector around the second angle associated with the second LUT is a product of a second integer and a second predefined elemental rotational angle.

12. A method for rotating an initial vector around a first angle and around a second angle using a lookup table (LUT) having LUT input entries and LUT output entries, each LUT input entry corresponding with a plurality of LUT output entries, the initial vector having signed components, for use in an electronic device, the method comprising:

(a) determining a value of the first angle around which to rotate the initial vector, a sense of rotation around the first angle, a value of the second angle around which to rotate an intermediate vector, and a sense of rotation around the second angle, the determining based on the signed components of the initial vector;

(b) setting a total incremental angular rotation counter to zero;

(c) identifying a LUT input entry of the LUT matching a LUT input, that represents the signed components of the initial vector;

(d) selecting an LUT output entry from the plurality of LUT output entries corresponding to the identified LUT input entry based on the first angle and the determined sense of rotation around the first angle, the LUT output entry including:
an incremental angular rotation of the initial vector around the first angle in the determined sense of rotation around the first angle, and
the signed components of the incrementally rotated vector;

(e) incrementing the total incremental angular rotation counter by the incremental angular rotation, comparing the total incremental angular rotation counter with the value of the first angle around which the initial vector is being rotated, and generating a comparator signal based upon the comparison;

(f) based on the comparator signal, iteratively repeating (c) to (e) for rotating the initial vector until the total incremental angular rotation counter is equal to the value of the first angle and the initial vector is rotated around the first angle, thereby forming the intermediate vector having signed intermediate components, wherein the signed components of the incrementally rotated vector of step (d) in a current iteration is used as the LUT input of step (c) in a next iteration of steps (c) to (e);

(g) setting the total incremental angular rotation counter to zero;

(h) identifying the LUT input entry of the LUT matching a LUT input that represents the signed intermediate components of the intermediate vector of step (d) in a last iteration of steps (c) to (e);

(i) selecting the LUT output entry from the plurality of LUT output entries corresponding to the identified LUT input entry based on the second angle and the determined sense of rotation around the angle, the LUT output entry including:
  an incremental angular rotation of the intermediate vector around the second angle in the determined sense of rotation around the second angle, and
  the signed components of the incrementally rotated intermediate vector;

(j) incrementing the total incremental angular rotation counter by the incremental angular rotation of the intermediate vector, comparing the total incremental angular rotation counter with the value of the second angle around which the intermediate vector is being rotated, and generating a second comparator signal based upon the comparison;

(k) based on the second comparator signal, iteratively repeating (h) to (j) for rotating the intermediate vector until the total incremental angular rotation counter is equal to the value of the second angle and the intermediate vector is rotated around the second angle, thereby forming a final vector having signed final components, wherein the signed components of the incrementally rotated intermediate vector of step (i) in a current iteration is used as the LUT input of step (h) in an next iteration of steps (h) to (j); and (l) generating an indication of an orientation of the electronic device in a reference frame based on the final vector.

13. The method of claim 12, further comprising:
receiving the signed components of the initial vector; and
generating the LUT input based on the received signed components of the initial vector.

14. The method of claim 12, wherein the signed components of the initial vector are measured with respect to a first coordinate system fixed to a mobile device having a sensor, and the initial vector is rotated to a second coordinate system defined with respect to a universal standard.

15. The method of claim 14, wherein the universal standard is a gravitational field or a magnetic field of the earth.

16. The method of claim 14, wherein the initial vector is a reference vector or a motion vector generated by the sensor.

17. The method of claim 16, wherein the reference vector is a gravitational field vector of the earth or a magnetic field vector of the earth, and the motion vector is an acceleration vector generated by the sensor.

18. The method of claim 12, wherein determining the value of the first angle and the value of the second angle is based on one or more trigonometric relationships between the signed components of the initial vector.

19. The method of claim 12, wherein the initial vector is rotated around the value of the first angle and the value of the second angle for aligning the initial vector with a coordinate axis, and wherein the determined sense of rotation around the first angle and the determined sense of rotation around the second angle is based on minimizing a number of incremental angular rotations of the initial vector for aligning the initial vector.

20. The method of claim 12, wherein the signed components of the initial vector include a signed x component, a signed y component and a signed z component, wherein the first angle is one of a polar angle and an azimuthal angle, and the second angle is the other of the polar angle and the azimuthal angle, and wherein the rotation about the azimuthal angle results in the initial vector being rotated to one of two planes orthogonal to each other, and rotation around the polar angle aligns the initial vector with one of an x, y and z axis.

21. The method of claim 12, wherein each LUT input entry of the LUT includes quantized signed x, y and z components of the initial vector, and wherein the plurality of corresponding output entries includes:
  a first corresponding LUT output entry including:
    quantized signed x, y and z components of the initial vector rotated by a smallest first incremental angular rotation in a first sense of rotation around the first angle, and
    the smallest first incremental angular rotation represented by a first integer;
  a second corresponding LUT output entry including:
    quantized signed x, y and z components of the initial vector rotated by a smallest second incremental angular rotation in a second sense of rotation around the first angle, the second sense opposite the first sense, and
    the smallest second incremental angular rotation represented by a second integer;
  a third corresponding LUT output entry including:
    quantized signed x, y and z components of the initial vector rotated by a smallest third incremental angular rotation in the first sense of rotation around the second angle, and
    the smallest third incremental angular rotation represented by a third integer; and
  a fourth corresponding LUT output entry including:
    quantized signed x, y and z components of the initial vector rotated by a smallest fourth incremental angular rotation in the second sense of rotation around the second angle, the second sense opposite the first sense, and
    the smallest fourth incremental angular rotation represented by a fourth integer.

22. The method of claim 21, wherein the smallest first incremental angular rotation is a product of the first integer and a first predefined elemental rotational angle of the first angle, wherein the smallest second incremental angular rotation is a product of the second integer and the first predefined elemental rotational angle of the first angle, wherein the smallest third incremental angular rotation is a product of the third integer and a second predefined elemental rotational angle of the second angle, and wherein the smallest fourth incremental angular rotation is a product of the fourth integer and the second predefined elemental rotational angle of the second angle.

23. A system for rotating a vector for use in an electronic device, the vector having signed components, the system comprising:
   at least one lookup table (LUT), the at least one LUT including data corresponding to the vector being rotated around a first angle and a second angle, the at least at one LUT having LUT input entries and LUT output entries;
   processing circuitry configured to access the at least one LUT for incrementally rotating the vector around the first angle and subsequently around the second angle, wherein accessing includes identifying an LUT input entry and selecting a corresponding LUT output entry, the corresponding output entry including an incremental angular rotation of the vector around the first angle or the second angle; and
   a comparator configured to receive the incremental angular rotation of the vector, increment a total incremental angular rotation counter by the incremental angular rotation, compare the total incremental angular rotation counter with the first angle or the second angle around which the vector is being rotated, and generate a comparator signal based upon the comparison, wherein
   the processing circuitry is further configured to:
      receive the comparator signal, and based upon the comparator signal, iteratively access the at least one LUT for completing the incremental rotation of the vector around the first angle and the second angle; and
      generate an indication of an orientation of the electronic device in a reference frame based on a vector generated in a last iteration of the incremental rotation.

24. The system of claim 23, wherein
   the at least one LUT includes a first LUT including the data corresponding to the vector being rotated around the first angle and a second LUT including the data corresponding to the vector being rotated around the second angle,
wherein
   the processing circuitry is configured to determine a value of the first angle around which to rotate the vector, a sense of rotation around the first angle, a value of the second angle around which to rotate the vector, and a sense of rotation around the second angle, the determining based on the signed components of the vector, wherein the processing circuitry is configured to:
   access the first LUT for incrementally rotating the vector around the first angle, including:
      (a) setting the total incremental angular rotation counter to zero;
      (b) identifying a LUT input entry of the first LUT matching an LUT input that represents the signed components of the vector;
      (c) identifying one of two LUT input entries adjacent to the identified LUT input entry based upon the determined sense of rotation around the first angle, and selecting the LUT output entry corresponding to the identified one of two adjacent LUT input entries, the LUT output entry including the incremental angular rotation of the vector around the first angle in the determined sense of rotation; and
      iteratively repeating step (c) until the comparator signal indicates that the total incremental angular rotation counter is equal to the value of the first angle and the vector is rotated around the first angle, the vector rotated to an intermediate vector having signed intermediate components, wherein the identified one of two adjacent LUT input entries of step (c) in a current iteration is used as the identified LUT input entry of step (c) in a next iteration;
   access the second LUT for incrementally rotating the intermediate vector around the second angle, including:
      (d) setting the total incremental angular rotation counter to zero;
      (e) identifying a LUT input entry of the second LUT matching the identified one of two adjacent LUT input entries of step (d) in a last iteration of steps (d) to (e), that represents the signed intermediate components of the intermediate vector;
      (f) identifying one of two LUT input entries of the second LUT adjacent to the identified LUT input entry of the second LUT based upon the determined sense of rotation around the second angle, and selecting an LUT output entry corresponding to the identified one of two adjacent LUT input entries of the second LUT, the LUT output entry of the second LUT including the incremental angular rotation of the intermediate vector around the second angle in the determined sense of rotation around the second angle; and
      iteratively repeating step (f) until the comparator signal indicates that the total incremental angular rotation counter is equal to the value of the second angle and the intermediate vector is rotated around the second angle, the intermediate vector rotated to an final vector having signed final components, wherein the identified one of two adjacent LUT input entries of step (f) in a current iteration is used as the identified LUT input entry of step (f) in a next iteration.

25. The system of claim 23, wherein:
   the at least one LUT includes a single LUT, each LUT input entry corresponding with a plurality of LUT output entries;
   the processing circuitry is configured to determine a value of the first angle around which to rotate the vector, a sense of rotation around the first angle, a value of the second angle around which to rotate the vector, and a sense of rotation around the second angle, the determining based on the signed components of the vector; and
   the processing circuitry is configured to access the LUT for incrementally rotating the vector, including:
      (a) setting the total incremental angular rotation counter to zero;
      (b) identifying a LUT input entry of the LUT matching a LUT input, the LUT input representing the signed components of the vector;
      (c) selecting an LUT output entry from a plurality of LUT output entries corresponding to the identified LUT input entry based on the first angle and the determined sense of rotation around the first angle, the LUT output entry including an incremental angular rotation of the vector around the first angle in the determined sense of rotation, and the signed components of the incrementally rotated vector;
      iteratively repeating (b) to (c) until the comparator signal indicates that the total incremental angular rotation counter is equal to the value of the first angle and the vector is rotated around the first angle, the vector rotated to an intermediate vector having signed intermediate components, wherein the signed components of the incrementally rotated vector of step (c) in a current iteration is used as the LUT input of step (b) in an next iteration of steps (b) to (c);

(d) setting the total incremental angular rotation counter to zero;

(e) identifying a LUT input entry of the LUT matching the LUT input, the LUT input representing the signed intermediate components of the intermediate vector;

(f) selecting an LUT output entry from a plurality of LUT output entries corresponding to the identified LUT input entry based on the second angle and the determined sense of rotation around the second angle, the LUT output entry including an incremental angular rotation of the intermediate vector around the second angle in the determined sense of rotation around the second angle, and the signed components of the incrementally rotated intermediate vector;

iteratively repeating (e) to (f) until the total incremental angular rotation counter is equal to the value of the second angle and the intermediate vector is rotated around the second angle, the intermediate vector rotated to a final vector having signed final components, wherein the signed components of the incrementally rotated intermediate vector of step (f) in a current iteration is used as the LUT input of step (e) in a next iteration of steps (e) to (f).

26. A method for rotating a vector, the vector having signed components, the method comprising:

accessing at least one lookup table (LUT), the at least one LUT including data corresponding to the vector being rotated around a first angle and a second angle, the at least at one LUT having LUT input entries and LUT output entries;

using the at least one LUT to incrementally rotate the vector around the first angle and subsequently around the second angle, wherein using includes identifying an LUT input entry and selecting a corresponding LUT output entry, the corresponding output entry including an incremental angular rotation of the vector around the first angle or the second angle;

incrementing a total incremental angular rotation counter by the incremental angular rotation;

comparing the total incremental angular rotation counter with the first angle or the second angle around which the vector is being rotated;

generating a comparator signal based upon the comparing;

iteratively accessing the at least one LUT, based upon the comparator signal, for completing the incremental rotation of the vector around the first angle and the second angle; and generating an indication of an orientation of the electronic device in a reference frame based on a vector generated in a last iteration of the incremental rotation.

27. The method of claim 26, wherein the signed components of the vector are measured with respect to a first coordinate system fixed to a mobile device having a sensor, and the vector is rotated to a second coordinate system defined with respect to a universal standard.

* * * * *